United States Patent [19]

Menning

[11] Patent Number: 5,111,167

[45] Date of Patent: May 5, 1992

[54] SURFACE ACOUSTIC WAVE DEVICE AND METHOD UTILIZING PLURAL MULTI-STRIP COUPLERS

[75] Inventor: Hunter W. Menning, Orlando, Fla.

[73] Assignee: Sawtek, Inc., Orlando, Fla.

[21] Appl. No.: 612,105

[22] Filed: Nov. 13, 1990

[51] Int. Cl.⁵ .............................................. H03H 9/42
[52] U.S. Cl. .................................... 333/151; 333/195; 310/313 D
[58] Field of Search ............................ 333/150–154, 333/193–195, 196; 310/313 R, 313 B, 313 C, 313 D, ; 29/25.35

[56] References Cited

U.S. PATENT DOCUMENTS

| Re. 32,859 | 2/1989 | Marshall et al. | 333/153 X |
| 3,988,703 | 10/1976 | De Vries | 310/313 R X |
| 4,038,614 | 7/1977 | Chapman et al. | 310/313 R X |
| 4,298,849 | 11/1981 | Arneson | 333/195 X |
| 4,513,261 | 4/1985 | Yen et al. | 310/313 C X |

FOREIGN PATENT DOCUMENTS

| 0140716 | 11/1981 | Japan | 333/195 |
| 1048569 | 10/1983 | U.S.S.R. | 333/194 |

Primary Examiner—Eugene R. LaRoche
Assistant Examiner—Seung Ham
Attorney, Agent, or Firm—Allen, Dyer, Doppelt, Franjola & Milbrath

[57] ABSTRACT

A surface acoustic wave device employs in-line input and output transducers disposed on a piezoelectrically active surface. Two U-configured multi-strip couplers are disposed between the input and output transducers in an overlapped, opposing configuration in order to convolve the side lobe energy from the input transducer across substantially all of the aperture of the output transducer.

6 Claims, 2 Drawing Sheets

SURFACE ACOUSTIC WAVE DEVICE AND METHOD UTILIZING PLURAL MULTI-STRIP COUPLERS

BACKGROUND OF THE INVENTION

The present invention relates to surface acoustic wave signal processing devices and methods which employ plural multi-strip couplers.

DESCRIPTION OF THE PRIOR ART

Surface acoustic wave (SAW) devices are well known in the art. Typically, a SAW device is fabricated on the surface of a piezoelectric substrate with input and output transducers. The input transducer excites a surface acoustic wave responsive to an electronic input and propagates the surface acoustic wave along the surface of the piezoelectric substrate to the output transducer which in turn detects the surface wave and converts that stimulus to an electronic output.

There are a number of different geometries for the input and output transducers available for the SAW device designer. One arrangement is referred to as the "in-line" configuration, where the aperture of the input transducer is directly opposite the aperture of the output transducer. Another geometry configuration is referred to as the "dual-line" configuration, in which the aperture of one transducer is offset from the aperture of the other transducer. Multi-strip couplers are used in the prior art for convolving the energy from the aperture of the input transducer to the aperture of the output transducer in the "dual-line" configuration. The multi-strip coupler performs the function of a directional coupler for freely propagating surface acoustic waves on the substrate. (See "Theory and Design of the Surface Acoustic Wave Multi-strip Coupler", Marshall et al, IEEE Transactions on Sonics and Ultrasonics, Volume SU-20, No. 2, April 1973, pp. 124-133; and "Surface Acoustic Wave Multi-strip Components and Their Applications", Marshall et al, IEEE Transactions on Sonics and Ultrasonics, Volume SU-20, No. 2, April 1973, pp. 133 et seq.) The multi-strip coupler serves the purpose of convolving all of the energy from each side lobe of the input transducer and then directing the energy from each side lobe across all of the side lobes of the output transducer. As is known, a multi-strip coupler functions as a "track changer", and therefore the two transducers must necessarily be placed on opposite sides of the multi-strip coupler and in opposite tracks in order to achieve an operable device.

With respect to the "in-line" approach, the surface acoustic wave designer has heretofore had three basic designs available, none of which have employed multi-strip couplers: first, an unweighted design, useful where shape factor and stop band rejection is not a concern; second, an overlap weighted to unweighted configuration, utilized where moderate shape factor and stop band rejection is needed; and third, an overlap weighted to withdrawn weighted configuration, which is utilized in those cases where shape factor and stop band rejection is a major factor.

However, when increased device performance is required, then it is necessary to use an overlap weighted to overlap weighted dual-line transducer configuration with a standard two track, multi-strip coupler between the input and output transducers. Such an arrangement is depicted in FIG. 1, and its typical response curve is shown in FIG. 2, both of which are described in detail next.

In FIG. 1, the SAW device 10 utilizes a substrate 12 having a piezoelectrically active surface 14. Deposited upon the surface 14 are input and output transducers positioned in a dual-line configuration. The input transducer comprises a pair of bus strips 18 one of which is coupled to bond pad 19, and plural interdigitated electrodes 20 between the two bus strips. The input transducer has an aperture, denoted generally by reference numeral 22, formed across the active length of the interdigitated electrodes 20. In a similar manner, the output transducer is formed by conductive bus strips 24, bond pad 25, interdigitated electrodes 26 and aperture 28. Disposed between the input and output transducers is a multi-strip coupler formed of plural metal strips 34. In FIG. 1, the transducers and the multi-strip coupler 34 are disposed in a dual-line configuration.

It will be noted that the prior art SAW device of FIG. 1 utilizing two track multi-strip coupler requires that the input and output transducers be offset one with respect to the other, thereby requiring an increased amount of surface geometry with respect to in-line transducer configurations, as noted by the dotted line 36 in FIG. 1. However, as is noted by the response curve 38 in FIG. 2, the sacrifice of surface geometry does achieve a reasonably good response for the band pass characteristics of the SAW device 10.

Prior art of interest with respect to the present invention includes the following U.S. Pat. Nos.: Chapman et al U.S. Pat. No. 4,038,614; Marshall et al Re-Issue No. 32,859; Hartmann et al U.S. Pat. No. 3,859,608; Arneson U.S. Pat. No. 4,298,849; Kagiwada et al U.S. Pat. No. 4,349,794; Hakita U.S. Pat. No. 4,468,642; and Yen et al U.S. Pat No. 4,513,261. The Chapman reference discloses, at FIG. 7, a single U-shaped multi-strip coupler in an in-line transducer configuration. Marshall et al discloses a variety of multi-strip coupler configurations, as does the Hartmann et al and Arneson references.

SUMMARY OF THE INVENTION

The present invention is directed to a SAW device and method utilizing a multi-strip coupler configuration which allows overlap weighted to overlap weighted transduce designs which operate efficiently in an in-line layout while achieving a good response characteristic. These objectives are obtained in a surface acoustic wave device in which the input and output transducers are disposed on the piezoelectrically active surface in line with each other, with two generally U-shaped multi-strip couplers disposed along the surface in overlapping relationship between the input and output transducer.

More specifically, each of the U-configured multi-strip couplers has a pair of branches extending generally normal to the path between the input and output transducers, with one branch of each U-configured multi-strip coupler extending between the two branches of the other. The branches of each multi-strip coupler extend substantially across the aperture of both the input and output transducers. As a result, the multi-strip couplers convolve all of the side lobe energy from the input transducer across substantially all of the aperture of the output transducer.

The multi-strip coupler configuration of the present invention permits a high degree of flexibility in obtaining variations in the time delay of the surface acoustic wave device during the design phase, while leaving the layout of the input and output transducer substantially unchanged. These objectives are achieved during the fabrication process by varying the separation between the multi-strip couplers in order to obtain that time delay variation, but while maintaining the physical separation of the input and output transducers constant. The present invention also permits flexibility in the tuning of the insertion loss of the device by varying the number of metalization strips in each multi-strip coupler.

THE DRAWING

FIG. 1, as described above, illustrates a prior art dual line double aperture surface acoustic wave device utilizing a track-changing multi-strip coupler configuration.

DETAILED DESCRIPTION

A detailed description of the SAW device and method of the present invention will now be described with reference to FIGS. 3 and 4.

Figure 3:
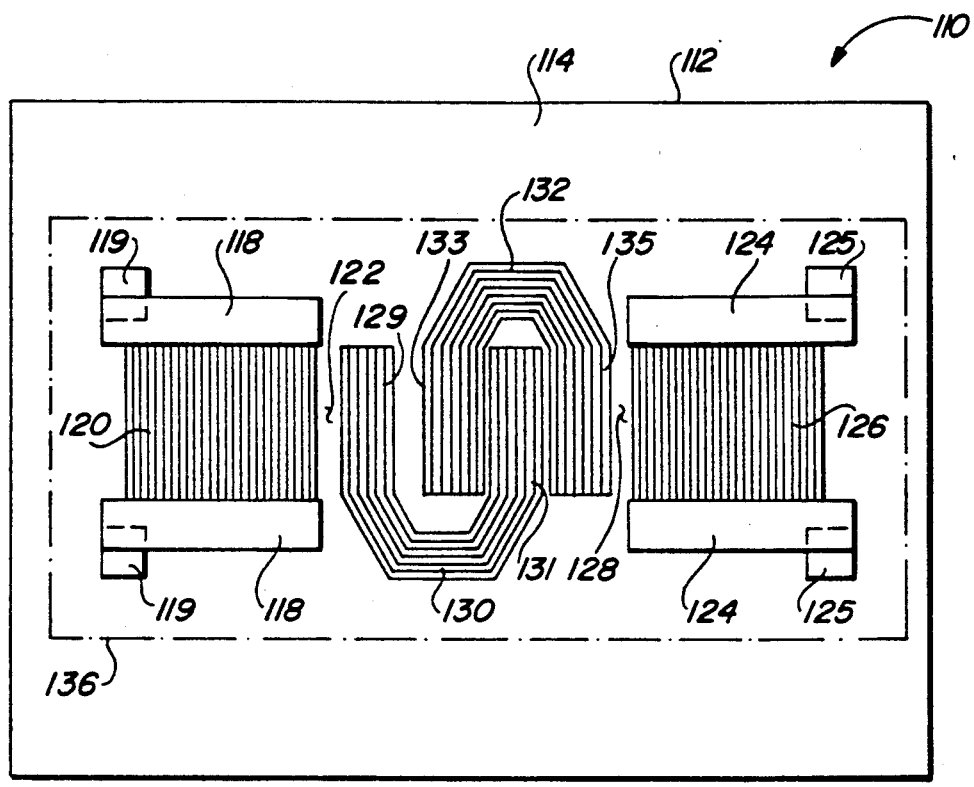
FIG. 3 illustrates a SAW device in utilizing multi-strip couplers in accordance with the present invention.

Noting FIG. 3, a SAW device 110 in accordance with the present invention utilizes a substrate 112 having a piezoelectrically active surface 114. Disposed upon the surface on the left side of FIG. 3 is an input transducer 30 consisting of bus strips 118, bond pads 119 and interdigitated electrodes 120. The input transducer forms a transmission aperture 122. As thus described, the input transducer is essentially identical to the input transducer shown in FIG. 1, except that the input transducer of FIG. 3 is not offset along the piezoelectric surface.

The SAW device 110 further includes an output transducer including bus strips 124, bond pads 125 and interdigitated electrodes 126. The output transducer defines a receiving aperture 128 for receiving incoming surface acoustic waves propagated along the piezoelectrically active surface 114. Again, it will be noted that the output transducer is positioned "in-line" with the input transducer of the SAW device 110, in contrast to the dual line configuration of the device 10 shown in FIG. 1.

In accordance with the present invention, good response characteristics for the SAW device 110 are achieved in the in-line configuration of the input and output transducers by utilizing a pair of U-configured multi-strip couplers positioned directly between the apertures 122 and 128. As is shown in FIG. 3, a first one of the U-configured multi-strip couplers comprises two generally parallel branches 129 and 131, each formed of like numbers of metalization strips. It will be noted that the length of each branch 129 and 131 extends entirely across the dimension of the apertures 122 and 28. (Of course, the configuration of the apertures may be modified using known apodization techniques). The two parallel branches 129 and 131 are interconnected by a bridging portion 130 of the U design.

In a like manner, the second U-configured multi-strip coupler comprises branches 133 and 135, which also extend across the dimension of the apertures 122 and 128 and are joined together by bridging portion 132. As shown in FIG. 3, the two U-configured multi-strip couplers are inverted with respect to each other and overlap by the extension of branch 131 between branches 133 and 135, and with branch 133 extending between branches 129 and 131.

Figure 1:
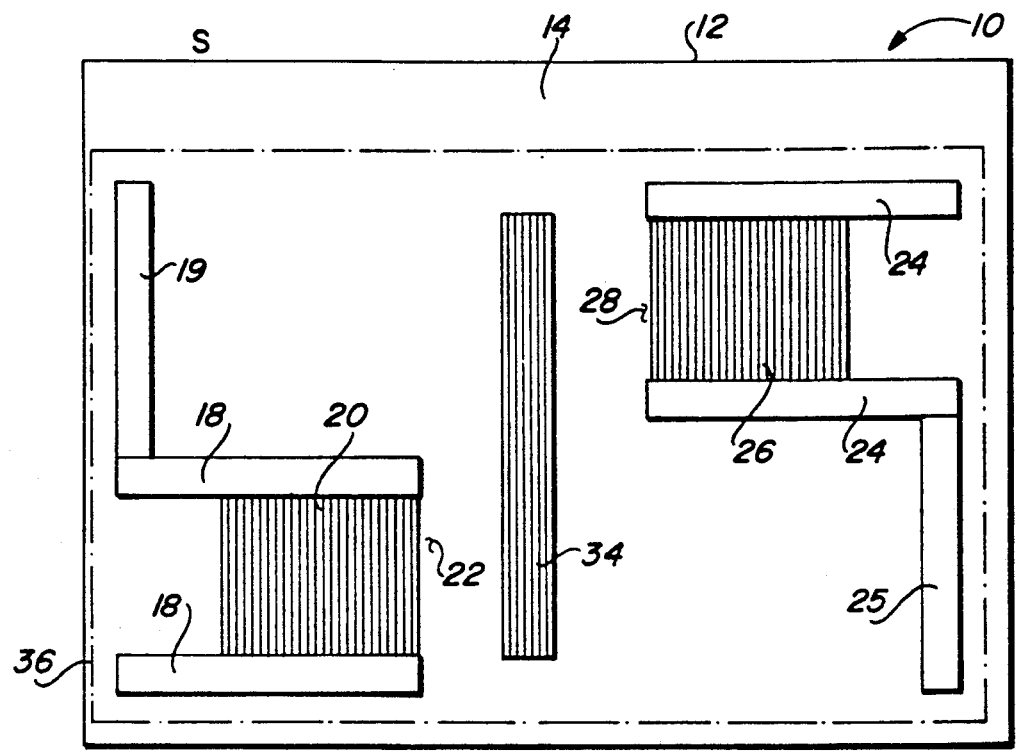

Dotted line 136 in FIG. 3, when compared to dotted line 36 in FIG. 1, illustrates that much less surface geometry is required to obtain the objectives of the overlap weighted to overlap weighted in-line transducer configuration of FIG. 3.

Figure 2:
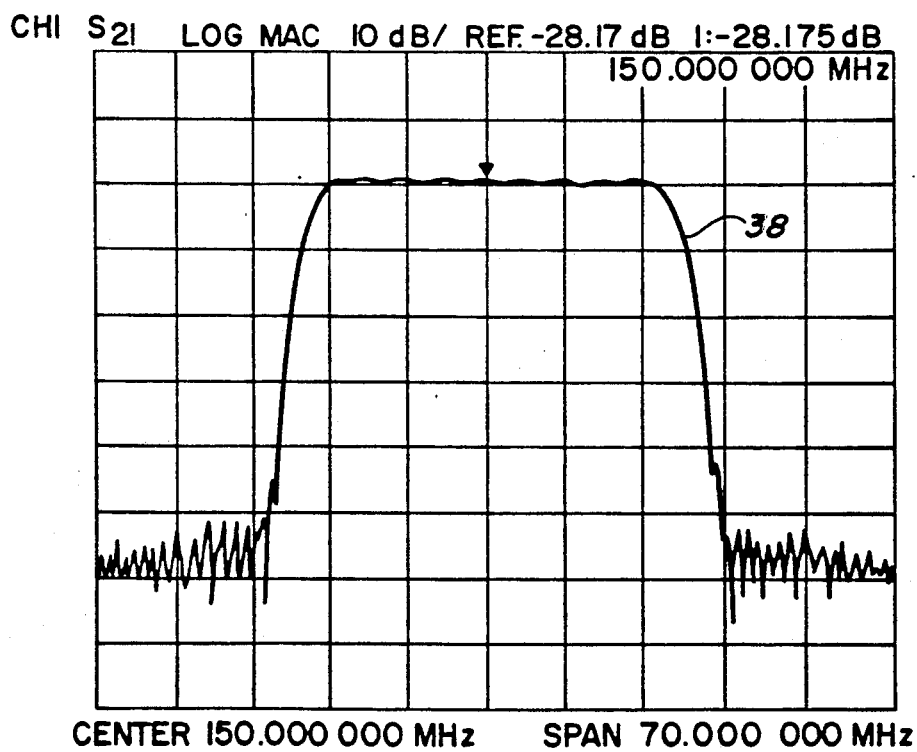
FIG. 2 is a response curve for the prior art SAW device of FIG. 1.
Figure 4:
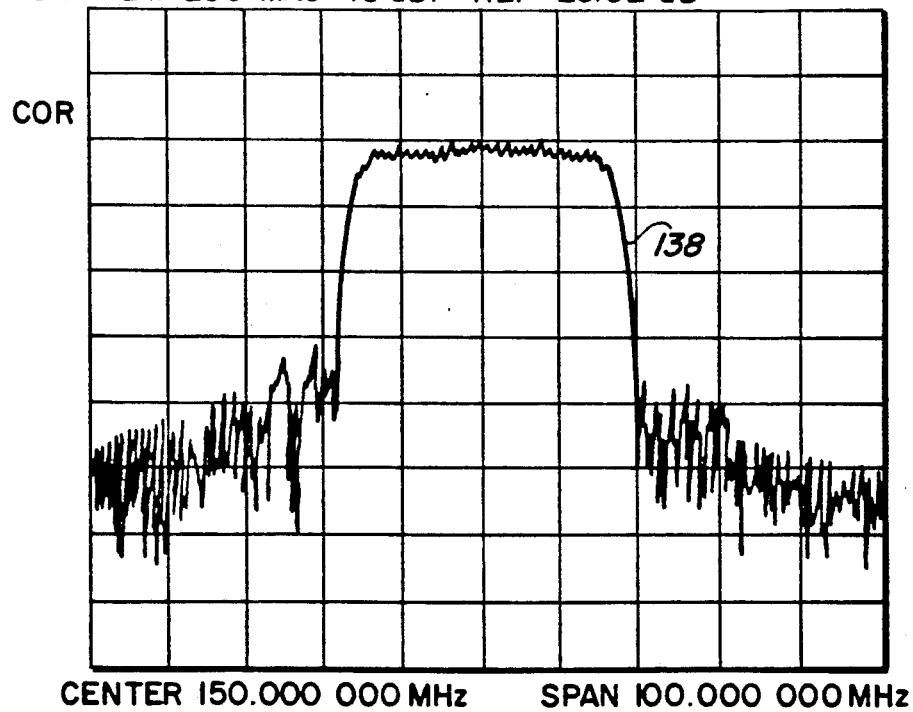
FIG. 4 is a typical response curve for the SAW device of FIG. 3.

FIG. 4 illustrates an actual response curve for a SAW device fabricated in accordance with the design of FIG. 3. When the response curve 138 of FIG. 4 is compared with response curve 38 of FIG. 2, it can be seen that the SAW device of FIG. 3 obtains a very good response characteristic.

Referring again to FIG. 3, it will be appreciated by those skilled in the art that the time delay of the surface acoustic wave device may be easily varied in the in-line arrangement there shown, by simply varying the separation between the two U-configured multi-strip couplers, while maintaining the physical separation of the input and output transducers constant. It will be understood that such variations may be obtained by modest changes to the masks for the multi-strip couplers, without substantial modifications for the entire masks involving the deposition of the input an output transducers. In a similar manner, the insertion loss of the device 110 may be tuned by simple variations in the number of strips in the two U-configured multi-strip couplers.

This concludes the description of the preferred embodiments. A reading by those skilled in the art will bring to mind various changes without departing from the spirit and scope of the invention. It is intended, however, that the invention only be limited by the following appended claims.

What is claimed is:

1. A surface acoustic wave device comprising a substrate, overlap weighted input and output transducers disposed on a piezoelectric surface of the substrate in line each with the other; and multi-strip coupler means disposed on the surface between the input and output transducers for convolving energy from the input transducer to the output transducer, the multi-strip coupler means comprising two generally U-shaped multi-strip couplers disposed along the surface in overlapping relationship one with the other between the input and output transducers.

2. The surface acoustic wave device recited in claim 1 wherein each U-configured multi-strip coupler has a pair of branches extending generally normal to the path between the input and output transducers, and wherein one branch of each U-configured multi-strip coupler extends between the two branches of the other multi-strip coupler in the overlapping relationship.

3. The surface acoustic wave device recited in claim 2 wherein the next adjacent branch of each U-configured multi-strip coupler nearest the input and output transducer extends across the dimension of the aperture of that transducer.

4. A surface acoustic wave device comprising:
a substrate having a piezoelectric surface;
input and output transducers disposed on the surface of the substrate in line each with the other;
two U-configured multi-strip couplers disposed on the surface between the input and output transducers, each U-configured multi-strip coupler having two branches extending generally normal to the path between the input and output transducers and disposed in overlapping relationship with one branch of each coupler extending between the two branches of the other coupler.

5. A method for varying the time delay of a surface acoustic wave device, comprising the steps of:
providing a die having a piezoelectric surface;
disposing input and output surface acoustic wave transducers along the surface with a space there between; and
varying the separation between two U-shaped multi-strip couplers and then positioning the two multi-strip couplers along the surface in the space between the input and output transducers, each U-shaped multi-strip coupler having a pair of branches extending generally normal to the path between the input and output transducers and further positioned in overlapping relationship with each other, the separation between the multi-strip couplers selected in order to vary the time delay of the surface acoustic wave device while maintaining the physical separation of the input and output transducers constant.

6. The method recited in claim 5 further comprising the step of tuning the insertion loss of the surface acoustic wave device by varying the number of strips in each multi-strip coupler.

* * * * *